US012586657B2

(12) United States Patent
Hu et al.

(10) Patent No.: US 12,586,657 B2
(45) Date of Patent: Mar. 24, 2026

(54) NONVOLATILE MEMORY WITH TEMPERATURE-DEPENDENT SENSE TIME OFFSETS FOR SOFT-BIT READ

(71) Applicant: Sandisk Technologies, Inc., Milpitas, CA (US)

(72) Inventors: Chengqing Hu, Milpitas, CA (US); Henry Chin, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 118 days.

(21) Appl. No.: 18/415,703

(22) Filed: Jan. 18, 2024

(65) Prior Publication Data

US 2025/0239323 A1     Jul. 24, 2025

(51) Int. Cl.
| | |
|---|---|
| *G11C 11/34* | (2006.01) |
| *G11C 7/04* | (2006.01) |
| *G11C 7/10* | (2006.01) |
| *G11C 29/52* | (2006.01) |

(52) U.S. Cl.
CPC ............... *G11C 29/52* (2013.01); *G11C 7/04* (2013.01); *G11C 7/1066* (2013.01); *G11C 7/1069* (2013.01)

(58) Field of Classification Search
CPC ......... G11C 29/52; G11C 7/04; G11C 7/1066; G11C 7/1069
USPC .................................................... 365/185.09
See application file for complete search history.

(56) References Cited

U.S. PATENT DOCUMENTS

| | | | | |
|---|---|---|---|---|
| 7,773,413 | B2 * | 8/2010 | Shalvi .................. | G11C 27/005 |
| | | | | 365/185.02 |
| 8,145,981 | B2 | 3/2012 | Mokhlesi et al. | |
| 8,429,493 | B2 * | 4/2013 | Sokolov .................. | G06F 12/00 |
| | | | | 714/763 |
| 9,064,594 | B2 | 6/2015 | Haratsch et al. | |
| 10,049,749 | B2 | 8/2018 | Shibata | |
| 10,446,242 | B2 | 10/2019 | Achtenberg et al. | |
| 10,636,504 | B2 * | 4/2020 | Reusswig .............. | G11C 29/52 |
| 10,719,271 | B2 * | 7/2020 | Alsasua .................. | G11C 16/26 |
| 10,908,845 | B1 * | 2/2021 | Lang ...................... | G06F 3/0679 |
| 10,991,444 | B1 * | 4/2021 | Bazarsky ............... | G11C 29/52 |
| 10,997,049 | B2 * | 5/2021 | Hiruta .................. | G06F 13/1673 |
| 11,029,889 | B1 * | 6/2021 | Sharon ................... | G11C 16/08 |
| 11,107,509 | B1 * | 8/2021 | Majerus ............... | G11C 16/26 |
| 11,307,799 | B2 * | 4/2022 | Lang ...................... | G11C 5/147 |
| 11,429,504 | B2 * | 8/2022 | Sheperek ............... | G06F 3/064 |
| 11,429,536 | B2 * | 8/2022 | Ueda ................... | G06F 11/3058 |
| 11,430,531 | B2 * | 8/2022 | Bazarsky ............. | G11C 29/021 |
| 11,461,039 | B2 * | 10/2022 | Kurosawa ............. | G06F 3/0604 |
| 11,486,767 | B2 * | 11/2022 | Terada ............... | G11C 16/3445 |

(Continued)

FOREIGN PATENT DOCUMENTS

TW            201203273 A   *   1/2012   ......... G11C 11/5642

*Primary Examiner* — Viet Q Nguyen
(74) *Attorney, Agent, or Firm* — Pearl Cohen Zedek Latzer Baratz LLP

(57) ABSTRACT

Control circuits configured to connect to a plurality of nonvolatile memory cells are configured to perform a soft-bit read of the plurality of nonvolatile memory cells by sensing the plurality of nonvolatile memory cells for a sense-time. The sense-time is obtained by adding a soft-read offset time to a hard-read sense time. The soft-read offset time is dependent on a temperature measurement value such that different soft-read offset times are applied for different temperature measurement values.

20 Claims, 15 Drawing Sheets

(56)  References Cited

U.S. PATENT DOCUMENTS

| | | | | |
|---|---|---|---|---|
| 11,538,534 | B1 * | 12/2022 | Zamir | G06F 3/0679 |
| 11,573,720 | B2 * | 2/2023 | Sheperek | G06F 3/0634 |
| 11,587,638 | B2 * | 2/2023 | Fitzpatrick | G11C 29/52 |
| 11,842,061 | B2 * | 12/2023 | Sheperek | G11C 29/50 |
| 11,894,068 | B2 * | 2/2024 | Hsu | G11C 16/0483 |
| 11,921,581 | B1 * | 3/2024 | Parashari | G06F 11/1076 |
| 11,934,688 | B2 * | 3/2024 | Eisenhuth | G06F 3/0655 |
| 12,204,442 | B2 * | 1/2025 | Tan | G11C 29/028 |
| 12,339,742 | B2 * | 6/2025 | Khakifirooz | G11C 11/5642 |
| 12,347,511 | B2 * | 7/2025 | Shen | G11C 29/50004 |
| 2017/0117053 | A1 | 4/2017 | Sharon et al. | |
| 2024/0395308 | A1 * | 11/2024 | Wang | G11C 11/40615 |

* cited by examiner

1500 performing a hard-read of a plurality of nonvolatile memory cells to obtain hard-read data using a hard-read sense time

1502 determining a temperature-dependent soft-read offset time from a temperature measurement value

1504 performing a soft-read of the plurality of nonvolatile memory cells to obtain soft-read data using a soft-read sense time that is different from the hard-read sense time by the temperature-dependent soft-read offset time.

Figure 16

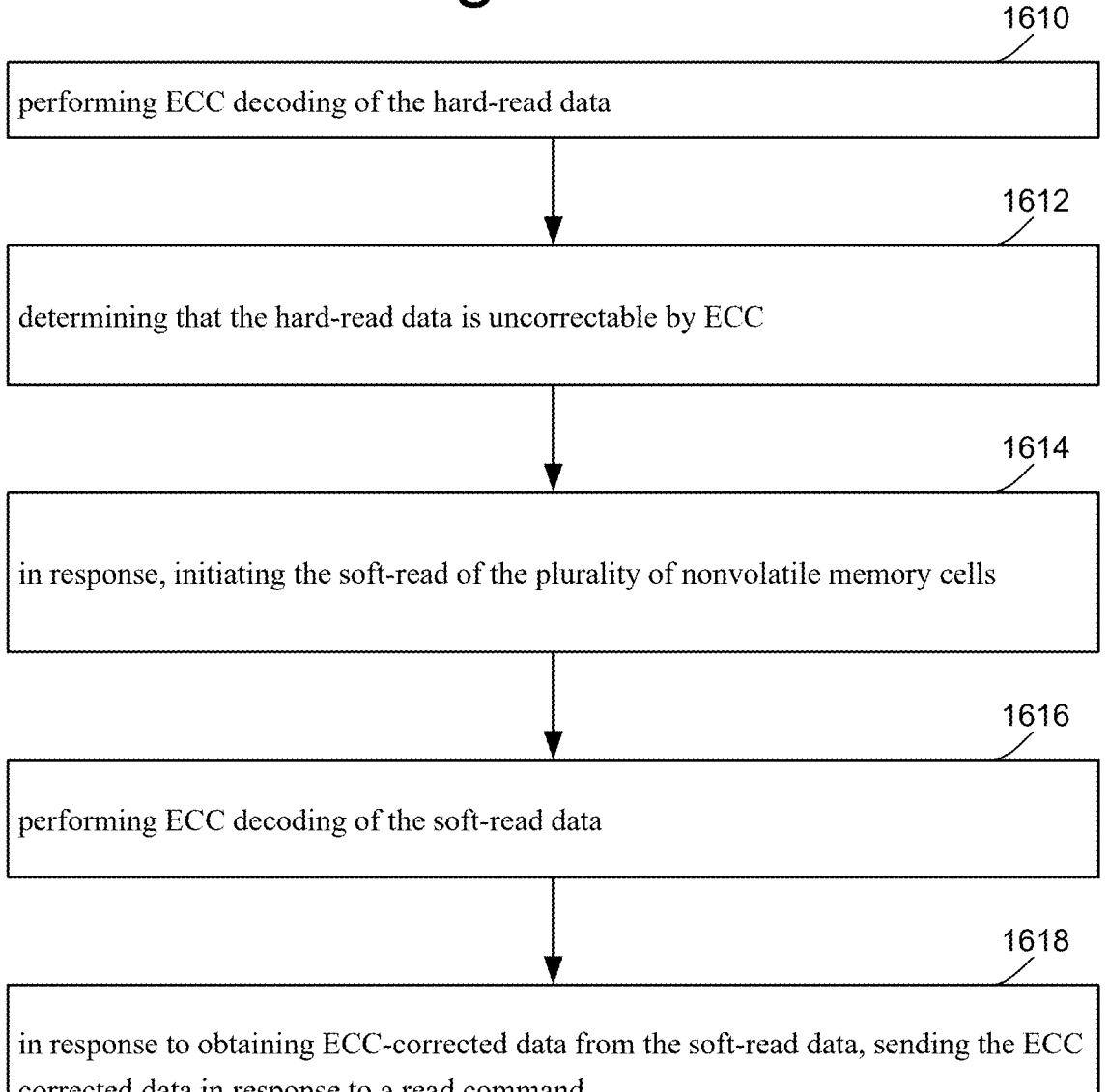

1610 performing ECC decoding of the hard-read data

1612 determining that the hard-read data is uncorrectable by ECC

1614 in response, initiating the soft-read of the plurality of nonvolatile memory cells

1616 performing ECC decoding of the soft-read data

1618 in response to obtaining ECC-corrected data from the soft-read data, sending the ECC corrected data in response to a read command.

NONVOLATILE MEMORY WITH TEMPERATURE-DEPENDENT SENSE TIME OFFSETS FOR SOFT-BIT READ

BACKGROUND

The present technology relates to non-volatile memory and read operations for reading non-volatile memory cells.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be three-dimensional. One type of three-dimensional structure has non-volatile memory cells arranged as vertical NAND strings. The memory structure may be arranged into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block.

The non-volatile memory cells may be programmed to store data. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

To read the data back from the memory cells it is typical to use read reference voltages in order to determine what data state a memory cell is presently in. If the Vt of a memory cell is at or below the read reference voltage, the memory cell will conduct a significant current. If the Vt of the memory cell is above the read reference voltage, the memory cell will not conduct a significant current. Read operations may be affected by temperature.

BRIEF DESCRIPTION OF THE DRAWINGS

Like-numbered elements refer to common components in the different figures.

FIG. 14 illustrates different soft-read offset times at different temperatures.

FIG. 15 shows an example of a method that includes a temperature-dependent soft-read offset time.

FIG. 16 shows an example of a method that includes writing ECC-corrected data to a new location.

DETAILED DESCRIPTION

Technology is disclosed herein for reading data stored in nonvolatile memory cells accurately over a range of temperatures. Examples of the present technology include performing a soft-read (soft-bit read or "SBR") to provide probability information for hard-read data (hard-bit read or "HBR"). Soft-read sensing may be performed by using different sense times (e.g., different to a sense time used for hard-bit read) to obtain probability information for corresponding hard-read data. Soft-read sense time(s) may be different to the hard-read sense time by offset(s) that is/are adjusted for temperature (e.g., using a temperature measurement value obtained by on-chip temperature measurement). In this way, different temperature-dependent offsets (e.g., adjusted or compensated for temperature) may be used at different temperatures when performing a soft-bit read.

Figure 1:
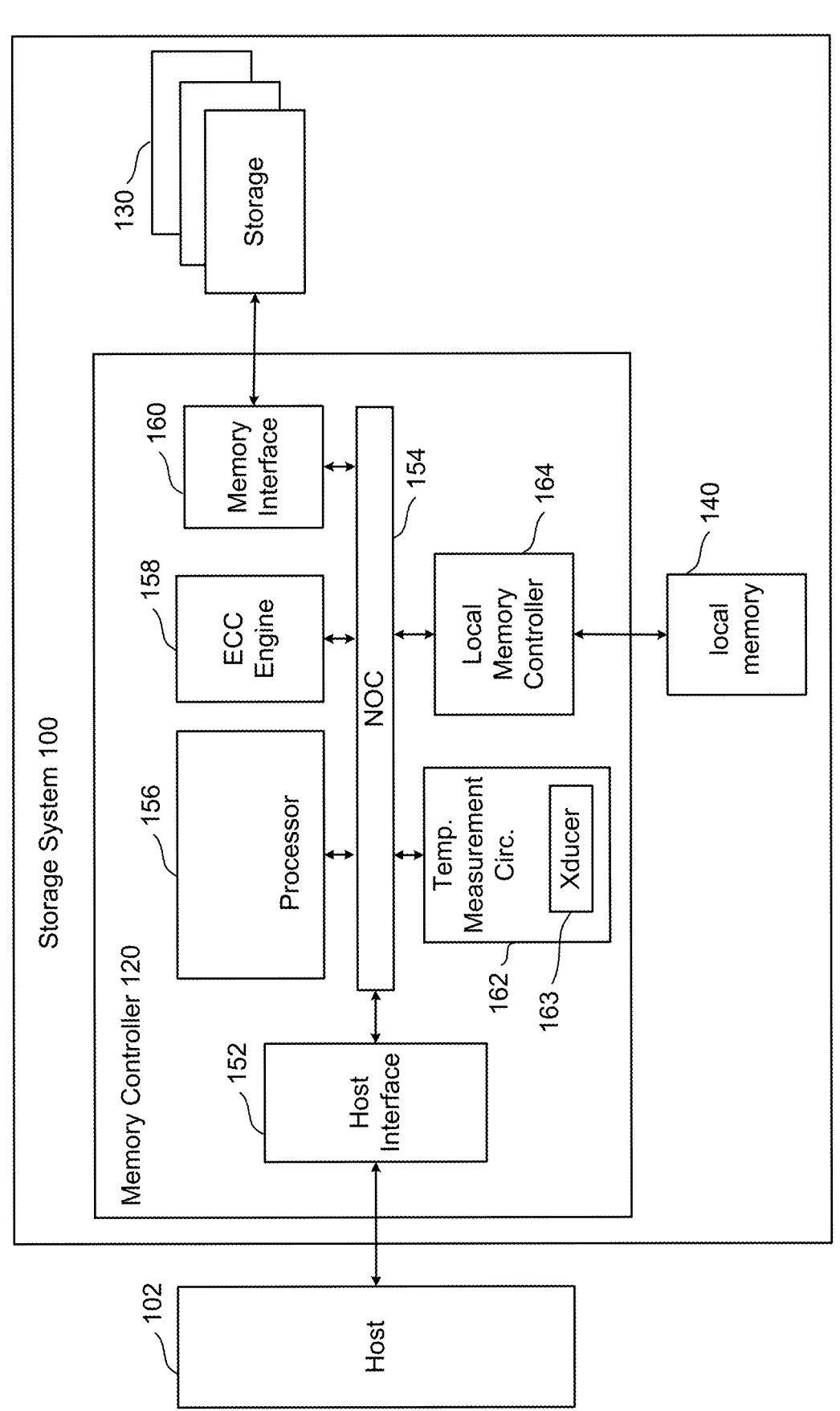
FIG. 1 is a block diagram depicting one embodiment of a storage system.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and is in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus.

Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables)

can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of memory controller 120) implements a scheduler and buffer for transmitting data to and receiving data from one or more memory die.

Temperature measurement circuit 162 includes temperature transducer 163 located in memory controller 120 (e.g., formed in a memory controller die). Temperature measurement circuit 162 may generate temperature measurement values from temperature sensing by transducer 163 (e.g., from measurement of a current, voltage, resistance or other metric or some combination of metrics). Temperature measurement values obtained by temperature measurement circuit 162 may be sent to other components of memory controller 120 and/or nonvolatile storage 130, which may use the temperature measurement values (e.g., to adjust certain parameters according to temperature).

Figure 2A:
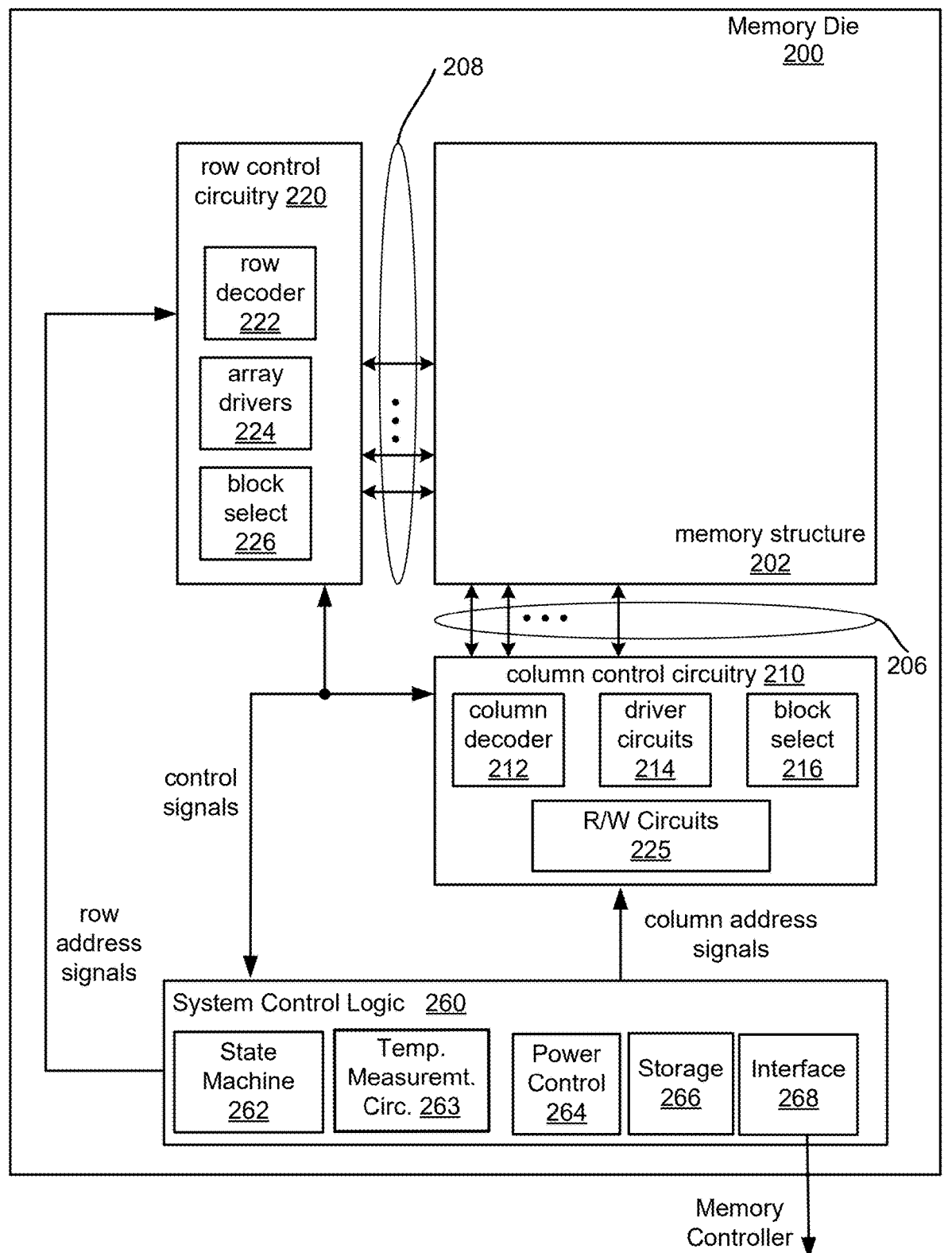
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic 260, and typically may include such circuits as row decoders 222, array drivers 224, and block select circuit 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only a single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuit 216, as well as read/write circuitry, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202. Temperature measurement circuit 263 may generate temperature measurement values from temperature sensing by one or more temperature transducers located in memory die 200. Temperature measurement values obtained by temperature measurement circuit 263 may be used by system control logic 260, read/write circuits 225 and/or other components to apply temperature adjustment according to on-chip temperature. Temperature measurement circuit 263 may be provided instead of or in addition to temperature measurement circuit 162.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
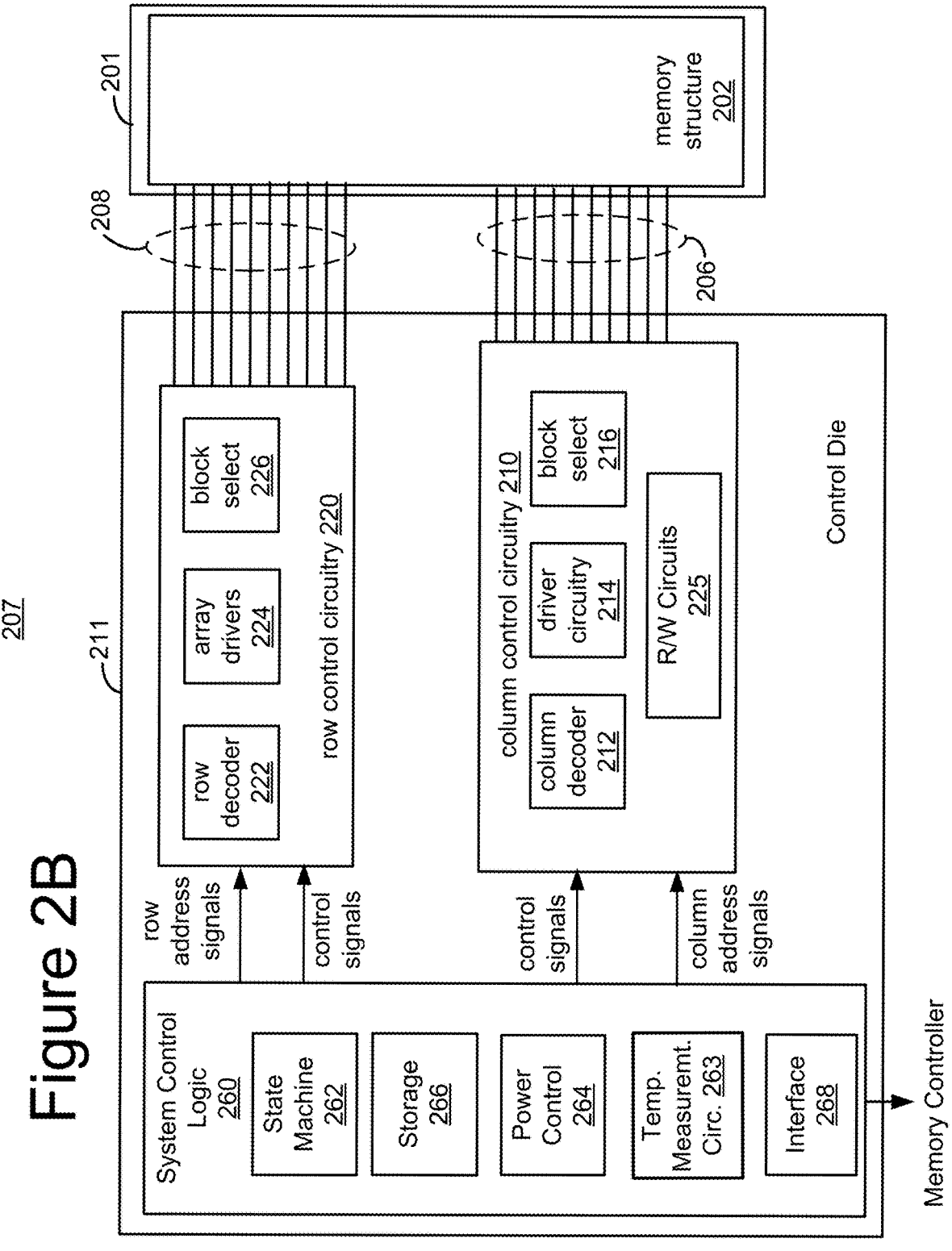
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate memory controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuits 214, and block select circuit 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select circuit 226 are coupled to memory structure 202 through electrical paths 208. Each of electrical path 208 may correspond to a word line, dummy word line, or select gate line. Additional electrical paths may also be provided between control die 211 and memory structure die 201. For example, one or more temperature transducer may be provided in memory structure die 201 and may be connected to system control logic 260 in control die 211 so that system control logic 260 may use temperature measurement values obtained from such temperature transducer(s) to adjust operating parameters according to temperature as appropriate. Temperature transducers may also or alternatively be provided in control die 211 and/or memory controller 120.

For purposes of this document, the phrases "a control circuit" or "one or more control circuits" can include any one of or any combination of memory controller 120, state machine 262, power control module 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 3:
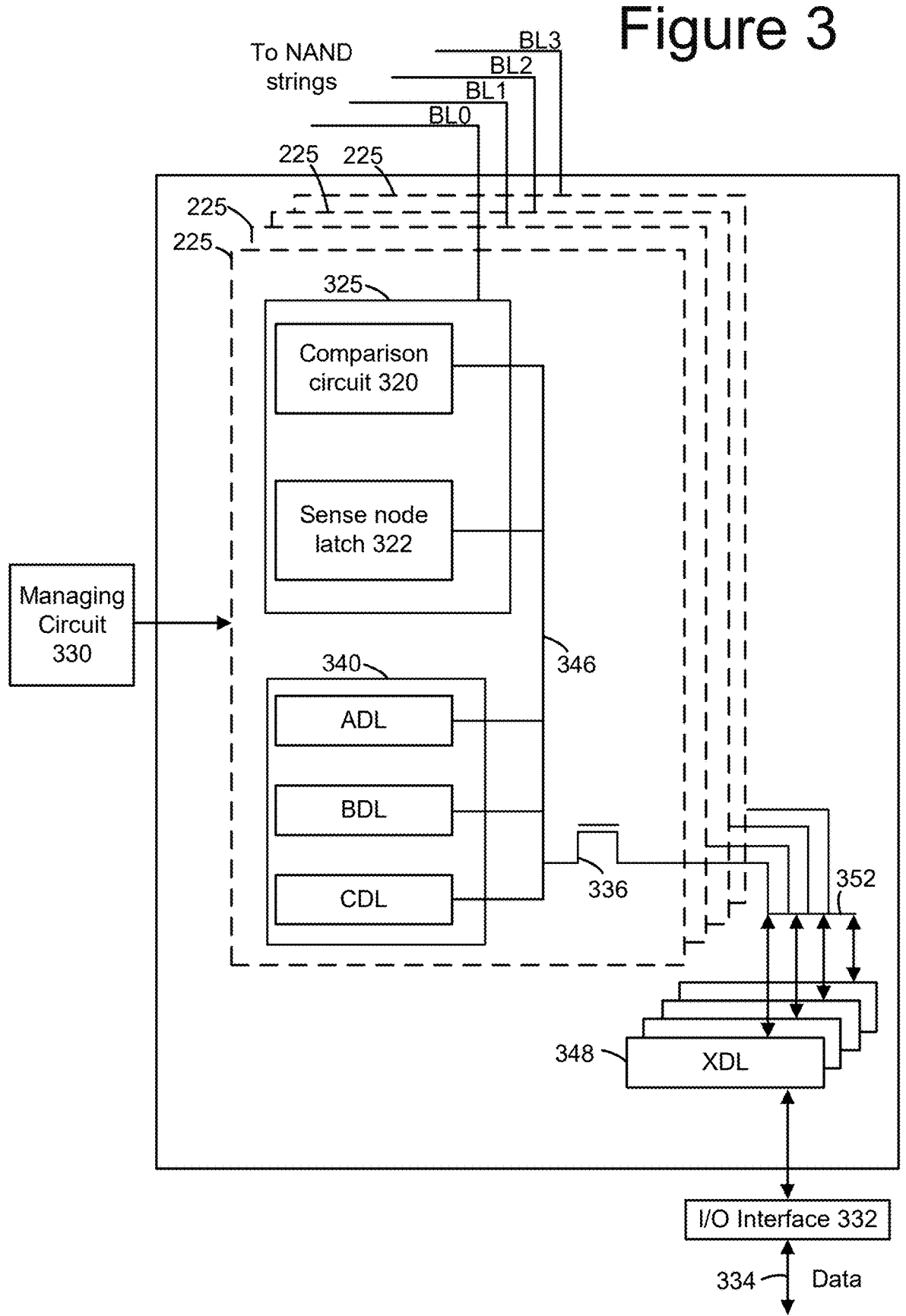
FIG. 3 is a block diagram depicting one embodiment of a portion of column control circuitry that contains a number of read/write circuits.

FIG. 3 is a block diagram depicting one embodiment of a portion of column control circuitry 210 that contains a number of read/write circuits 225. Each read/write circuit 225 is partitioned into a plurality of sense amplifiers 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier.

Each sense amplifier 325 may have a sense node. During sensing, a sense node is charged up to an initial voltage, Vsense_init, such as 3V. The sense node is then connected to the bit line for a sense time, and an amount of decay of the voltage of the sense node during the sense time is used to determine whether a memory cell is in a conductive or non-conductive state. The amount of decay of the sense node also indicates whether a current Icell in the memory cell exceeds a reference current, Iref. A larger voltage drop corresponds to a larger current. If Icell<=Iref, the memory cell is in a non-conductive state and if Icell>Iref, the memory cell is in a conductive state. In an embodiment, the sense node has a capacitor that is pre-charged and then discharged for the sense time. In some embodiments, the length of the sense time is controlled so that different sense times may be used as appropriate.

Comparison circuit 320 determines the amount of voltage drop by comparing the sense node voltage to a trip voltage after the sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation.

The data latches 340 are coupled to the sense amplifier 325 by a local data bus 346. The data latches 340 include three latches (ADL, BDL, CDL) for each sense amplifier 325 in this example. More or fewer than three latches may be included in the data latches 340. In one embodiment, for programming each data latch 340 is used to store one bit to be stored into a memory cell and for reading each data latch 340 is used to store one bit read from a memory cell. In a three bit per memory cell embodiment, ADL stores a bit for a lower page of data, BDL stores a bit for a middle page of data, CDL stores a bit for an upper page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading or program-verify, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or program-verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a program-verify operation to determine if the memory cells has been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate. However, in some embodiments, verify is not performed. If verify is not performed, memory cells may still be locked out after a pre-determined number of pulse have been applied to the cell given the target data state.

Figure 4:
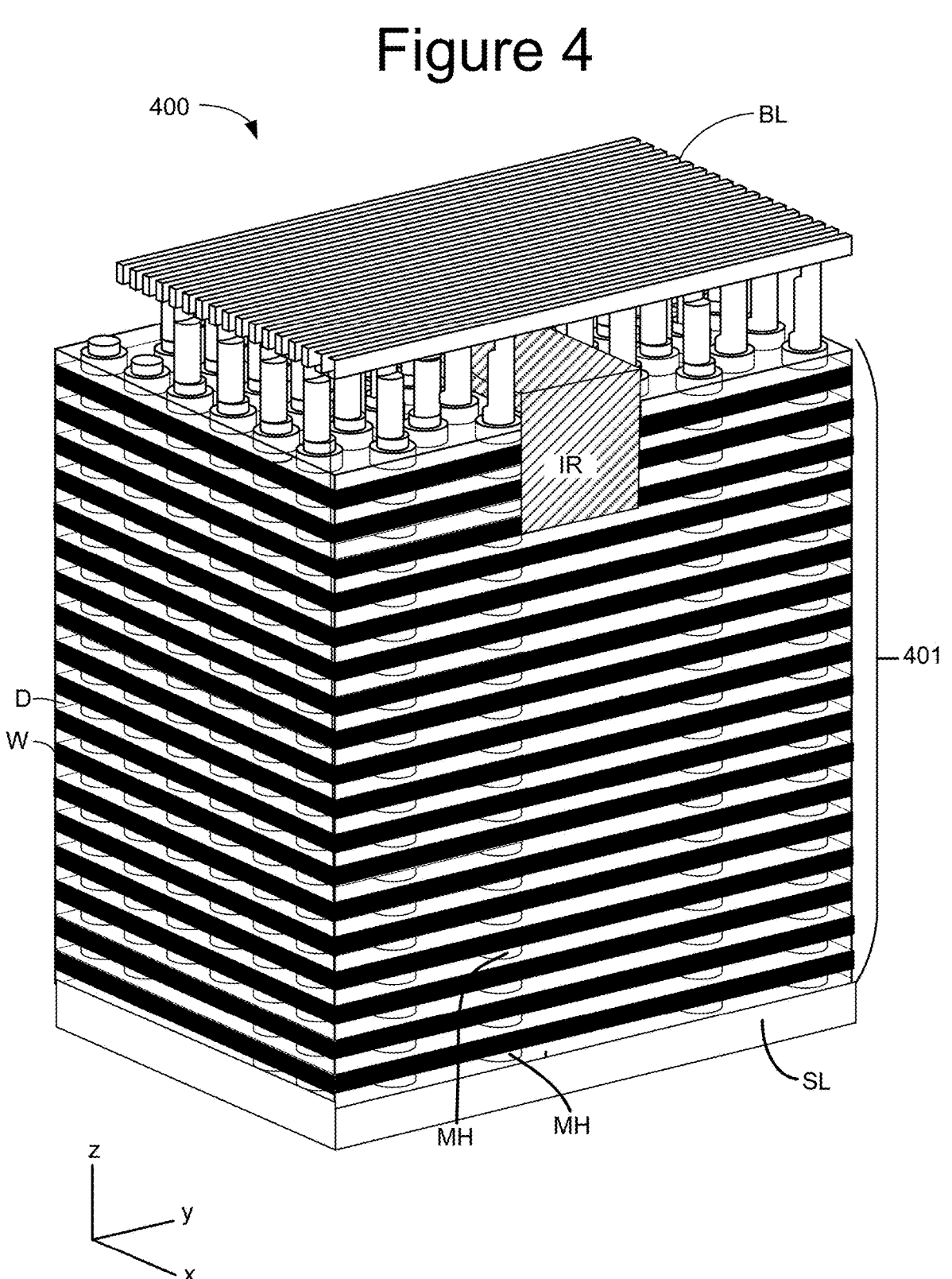
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figures 5A, 5B:
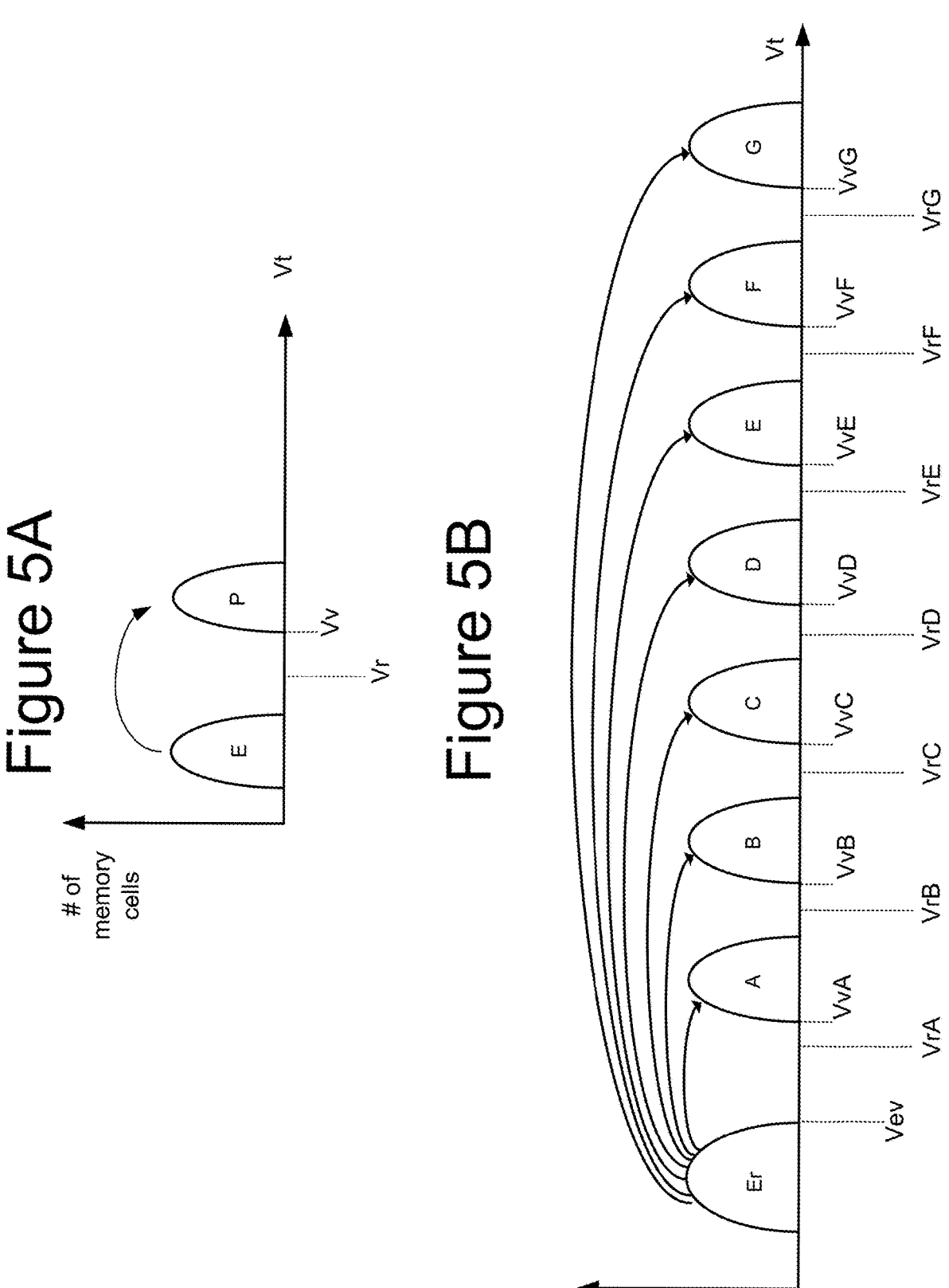
FIGS. 5A and 5B depict threshold voltage distributions.

Memory cells in a memory system may be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine whether a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv in a program-verify (or "verify") operation. In some embodiments, verify is not performed during SLC programming.

Memory cells that are configured to store multiple bit per memory cell data are referred to as multi-level cells ("MHLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores three bits of data. Other embodiments may use other data capacities per memory cell (e.g., such as two, four, or five bits of data per memory cell). Memory cells may be configured for SLC or MLC storage of data. In some cases, a block of nonvolatile memory cells may be configured for SLC data storage at one time and configured for MLC data storage at another time.

FIG. 5B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. In an embodiment, the number of memory cells in each state is about the same.

FIG. 5B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5B also shows a number of verify reference voltages. The verify voltages are VvA, VvB, VvC, VvD, VvE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is inhibited (locked out) from further programming. Similar reasoning applies to the other data states. In some embodiments, verify is not performed during MLC programming.

While FIGS. 5A-B show threshold voltage distributions as distinct distributions that are separated from each other, real threshold voltage distributions may not be separated as shown (e.g., a distribution may partially overlap one or more neighboring distributions), which may make distinguishing different threshold voltage distributions more challenging. Also, threshold voltage distributions may not be identical across all nonvolatile memory cells of a memory die over time and under different conditions. Threshold voltage distributions may shift for a number of reasons including environmental reasons (e.g., temperature or other external parameter), leakage, effects of programming or erasing neighboring memory cells and effects of read operations on cells being read and/or neighboring cells, which may add to the difficulty of accurately distinguishing different threshold voltage distributions (e.g., when reading nonvolatile memory cells to determine corresponding data states).

Figure 6:
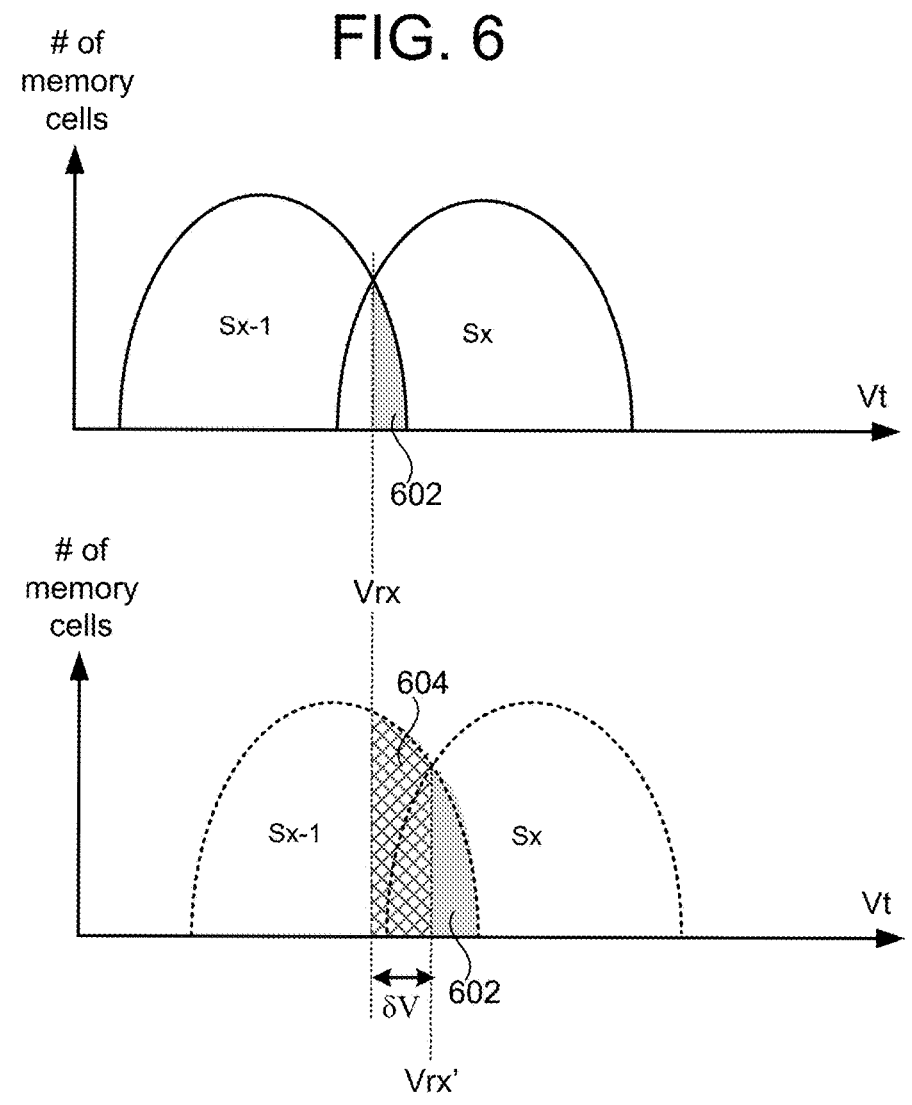
FIG. 6 shows an example of reading with different read reference voltages.

FIG. 6 shows an example of two neighboring threshold voltage distributions Sx and Sx-1 (e.g., any two adjacent distributions of Er-G in FIG. 5B). A read reference voltage Vrx is used to perform a read operation to distinguish between memory cells in distributions Sx and Sx-1. The upper plot shows an example in which Vrx is optimally positioned so that the number of errors (indicated by the shaded area 602, which corresponds to cells programmed to data state Sx-1 which are read as being in data state Sx) is relatively small. For example, the number of errors from such a read step may be correctable by ECC. The lower plot shows an example in which Vrx is not optimally positioned (e.g., after some change in threshold voltage distributions has occurred). Performing a read operation using Vrx in this case results in a large number of errors (shown by the additional errors indicated by area 604). Such a large number of errors may not be correctable by ECC (e.g., data may be Uncorrectable by ECC, or "UECC"), which may result in read failure (e.g., cannot return data requested by a host).

In some cases, when data is found to be UECC or where data from a read step otherwise fails to meet a predetermined standard, another read step may be performed using a different read reference voltage. For example, one or more different read reference voltages may be used that is/are offset from the initial. In the example of FIG. 6, an additional read may be performed using read reference voltage Vrx', which greater than Vrx by an offset voltage δV. Because Vrx' is at the optimal voltage for the shifted distributions of the lower plot, the resulting errors (shown by area 602) is much smaller than when using Vrx (errors reduced by area 604) and the resulting data may be correctable by ECC.

The read reference voltage(s) (or read reference voltage (s)) used in read operations may affect the number of errors in the resulting data as illustrated in FIG. 6. In some cases, shifts in threshold voltage distributions may be at least partially predictable and read reference voltages may be shifted accordingly (e.g., using a prediction to get an offset read reference voltage). In some cases, shifts in threshold voltage distributions may be at least partially unpredictable, in which case different one or more offset read reference voltages may be used to obtain probability data (soft data) that can be used to decode ECC encoded data to obtain the original data (e.g., the data that was originally sent by a host).

Figure 7:
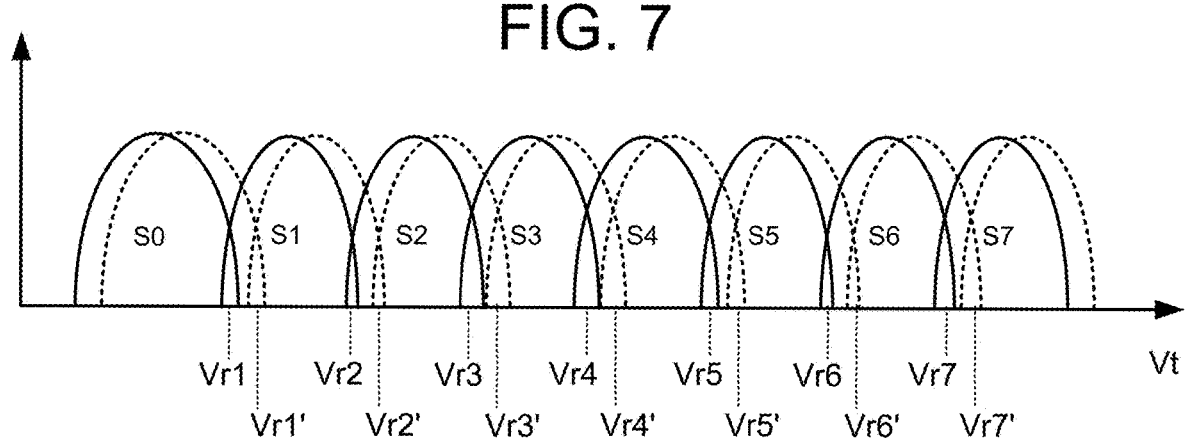
FIG. 7 shows an example of reading 8 data states with adjusted read reference voltages.

FIG. 7 shows an example in which data states S0-S7 are shifted, with shifted voltage distributions shown by dotted lines. While first read reference voltages Vr1-Vr7 may be adequate for reading distributions S0-S7 prior to shifting, using read reference voltages Vr1-Vr7 to read the shifted distributions may result in significant numbers of errors (e.g., UECC data). FIG. 7 shows second read reference voltages Vr1'-Vr7', which may be used to read shifted threshold voltages. Second read reference voltages Vr1'-Vr7' may be offset from first read reference voltages Vr1-Vr7 by one or more offset voltage (e.g., as shown by offset voltage δV). For example, the same offset voltage (e.g., δV) may be used for each read reference voltage (e.g., Vr1'=Vr1+δV; Vr2'=Vr2+δV; Vr3'=Vr3+δV and so on) or different offset voltages (e.g., δV1, δV2, δV3 . . . ) may be used for each read reference voltage (e.g., Vr1'=Vr1+δV1; Vr2'=Vr2+δV2; Vr3'=Vr3+V3 and so on. In an example, temperature may have a predictable effect on threshold voltage distributions and read reference voltages may be offset based on temperature to account for any such shift. For example, one or more on-chip temperature transducer (e.g., on a memory die) may generate a temperature measurement value, which may be used to adjust one or more read reference voltage (e.g., to adjust Vr1 to Vr1' by δV1 where δV1 depends on the temperature measurement value).

In some cases, when data is read with a high number of errors (e.g., UECC) or otherwise fails to meet a specified standard, reading may be repeated using one or more different read reference voltages to obtain probability data regarding data states of memory cells. A first read operation may be considered a "hard" read to obtain a bit (e.g., either a logic 0 or 1), while subsequent read operations may be considered "soft" reads to obtain probability regarding the bit (e.g., higher or lower confidence that the bit identified by the hard read is correct).

Figure 8:
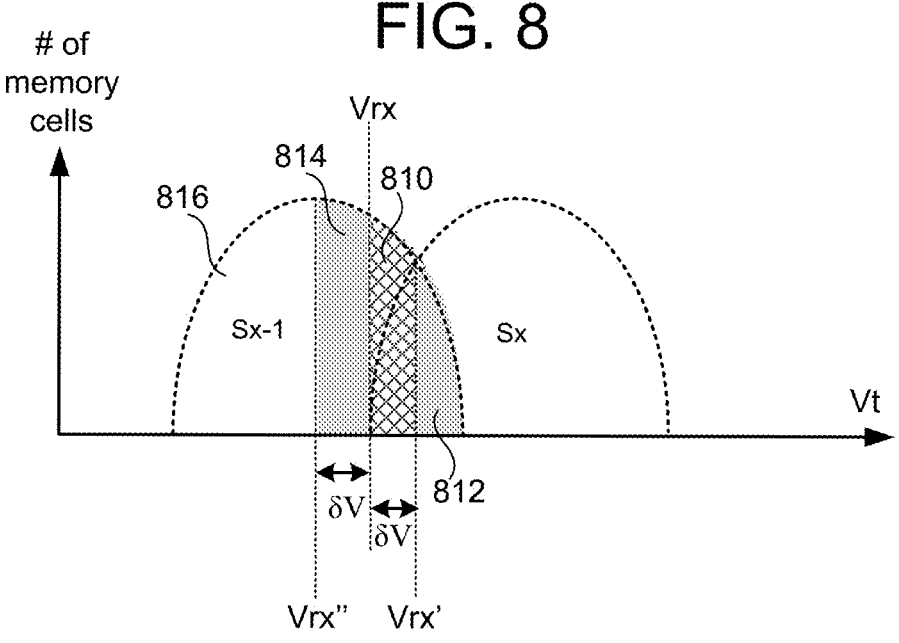
FIG. 8 shows an example of hard-read and soft-read reference voltages.

FIG. 8 shows an example in which a hard read is performed using read reference voltage Vrx, which results in a high number of errors (e.g., as illustrated by areas 810 and 812, which represent memory cells that were programmed to the data state Sx-1 and are read as being in data state Sx using Vrx). Subsequently, a soft-read may be performed using two soft read reference voltages, Vrx' and Vrx", that are offset by δV above and below hard read reference voltage Vrx to give probability information, which may facilitate decoding. For example, memory cells that are read as being in data state Sx using Vrx and are also read as being in data state Sx using Vrx' (area 812) may be considered to have a high probability of being in data state Sx (high probability that hard-read bit is correct) while memory cells that are read as being in data state Sx using Vrx and read as being in data state Sx-1 when read using Vrx' (area 810) may be considered to have a low probability of being in data state Sx (low probability that hard read bit is correct). Similarly, memory cells that are read as being in data state Sx-1 using Vrx and are also read as being in data state Sx-1 using Vrx" (area 816) may be considered to have a high probability of being in data state Sx-1 (high probability that hard-read bit is correct) while memory cells that are read as being in data state Sx-1 using Vrx and read as being in data state Sx when read using Vrx" (area 814) may be considered to have a low probability of being in data state Sx-1 (low probability that hard read bit is correct). When threshold voltage shifts are predictable one offset read reference voltage may be sufficient (e.g., where distributions are predicted to shift upward in threshold voltage as shown, Vrx' may be sufficient). When voltage shifts are not predictable, one or more additional soft-reads may be performed at read reference voltage(s) above and/or below the hard-read reference voltage (e.g., Vrx) may be used to obtain additional soft-read data, which may then be used by an ECC engine to assist decoding data (e.g., by flipping hard-read bits that have a low probability of being correct and keeping hard-read bits that have a high probability of being correct). In this way, soft-read operations may enable decoding of data when hard-read data is UECC.

Figure 9:
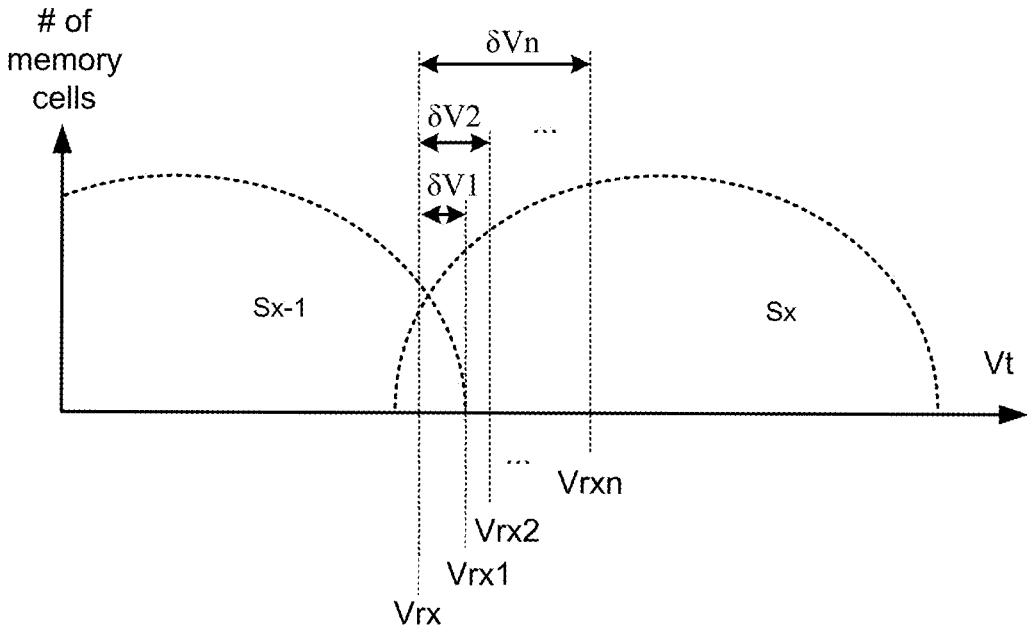
FIG. 9 shows an example of hard-read and soft-read reference voltage.

FIG. 9 shows an example of n offset read reference voltages, Vrx1 to Vrxn (soft-read reference voltages), that are offset from a hard-read reference voltage, Vrx, by different voltage offsets (δV1, δV2 . . . δVn). While soft-read reference voltages are only shown on one side of hard-read reference voltage, Vrx (at higher voltages than Vrx), in this example, in other examples, additional soft-reads may be performed at soft-read reference voltages on either side of Vrx (e.g., lower voltages also). The number of offset read reference voltages used in a soft-read operation to obtain soft-read data (e.g., the value of n) and the pattern of such offset reads (e.g., symmetric/asymmetric, magnitudes of voltage offsets δV1, δV2 . . . δVn) may be selected according to a number of factors and the present technology is not limited to any particular soft-read example.

As previously described with respect to FIG. 3, threshold voltages of nonvolatile memory cells may be sensed by allowing discharge through memory cells over a period of time (sense time) and then comparing the resulting voltage with a reference voltage. By varying the sense time in such sensing operations, a memory cell may be sensed in a way that provides additional data (e.g., soft-read data) in a way that is similar to data obtained by varying read reference voltage (e.g., soft-read data may be obtained by using different sense times that is equivalent to soft-read data obtained using different soft-read reference voltages as shown in FIGS. 8 and 9). In some cases, changing sense time may be preferable (e.g., a fixed read reference voltage may be applied to a word line throughout multiple sensing operations using different sense times, which may be simpler and faster than applying different read reference voltages for each sensing operation).

Figure 10:
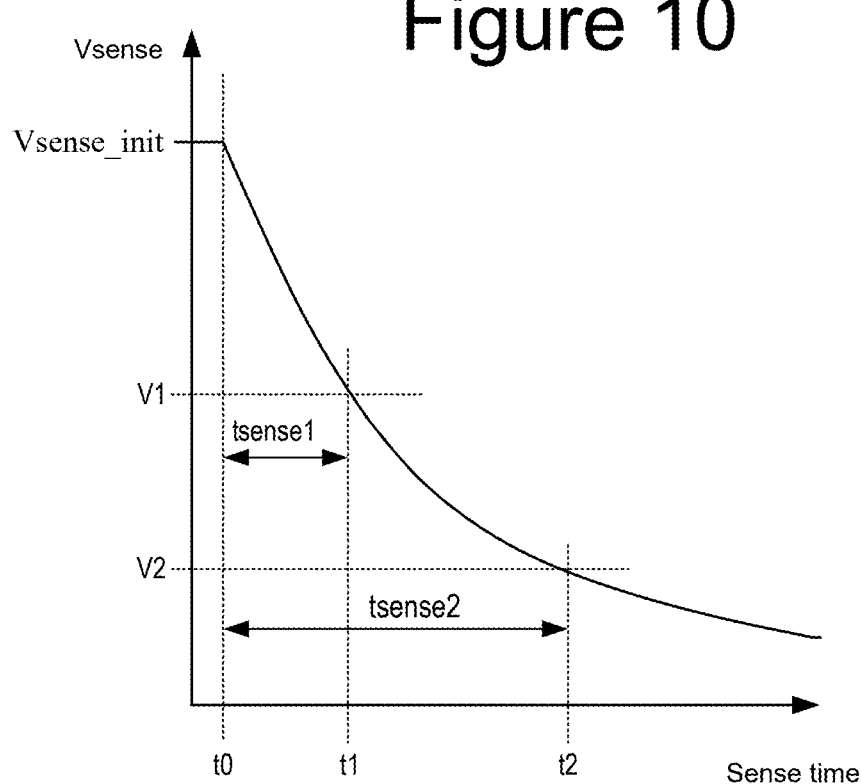
FIG. 10 shows an example of correspondence between sense time and sense voltage.

FIG. 10 shows an example of discharge through a non-volatile memory cell (e.g., discharge from a precharged voltage). The vertical axis shows a voltage (Vsense) at a sense node (e.g., a sense node of sense amplifier 325) and the horizontal axis shows sense time. Vsense starts at an initial voltage, Vsense_init, which may be the result of precharging. At time t0, discharge begins and the voltage drops as current flows through the nonvolatile memory cell according to how conductive the nonvolatile memory cell is (e.g., more current flows through a more conductive nonvolatile memory cell, which causes Vsense to drop faster than if the nonvolatile memory cell is nonconductive). In a first example, a sense operation is performed at time t1 (after a time tsense1) so that voltage V1 is compared with the reference voltage. In a second example, a sense operation is performed at time t2 (after time tsense2) so that voltage V2 is compared with the reference voltage. Because V2 is less than V1, it is more likely that the sensed voltage is less than the reference voltage after tsense2 than after tsense1 and thus more likely that the nonvolatile memory cell is detected as being conductive (having a threshold voltage below the read reference voltage) after tsense2. Thus, increasing the sense time may cause more cells to be read as conductive in a manner that is similar to applying a higher read reference voltage (e.g., reading with a read reference voltage that is offset at a higher voltage such as increasing from Vrx to Vrx' in FIG. 8 or to Vrx1-Vrxn in FIG. 9). Shortening the sense time may cause fewer cells to be read as conductive in a manner that is similar to applying a lower read reference voltage (e.g., reading with a read reference voltage that is offset at lower voltage such as decreasing from Vrx to Vrx" in FIG. 8).

Figures 11A, 11B:
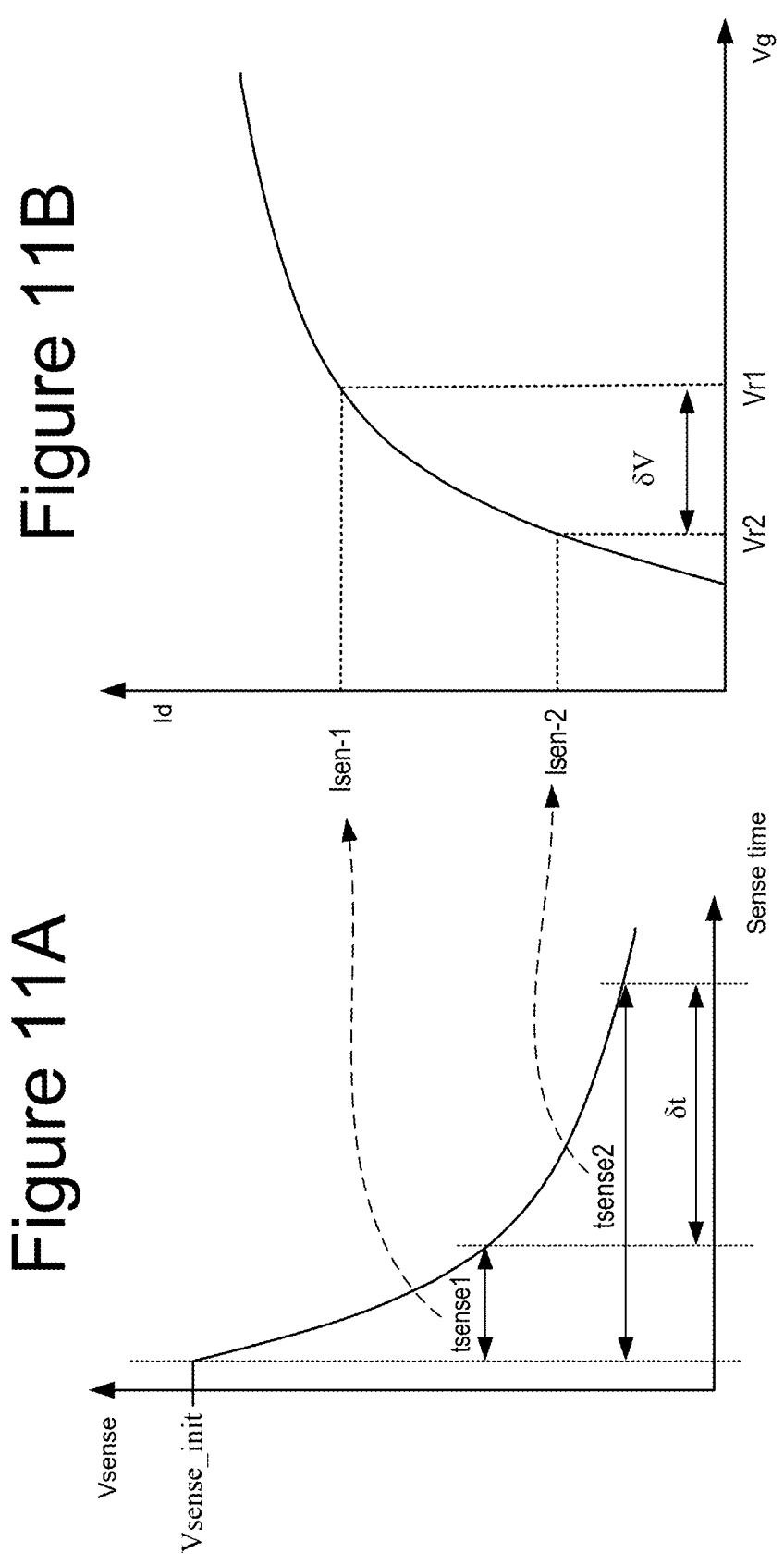
FIGS. 11A-B illustrate different sense times.

FIGS. 11A-B illustrate an example of how different sense times may be used to read nonvolatile memory cells in a way that may provide soft-read data that can be used to obtain corrected data (e.g., when hard-read data is UECC).

FIG. 11A shows a plot of voltage at a sense node, Vsense, as function of sense time that is similar to FIG. 10. Vsense drops as the sense node (e.g., sense node of sense amplifier 325) discharges through a memory cell that is being sensed. The amount of discharge current flowing through the memory cell while a given program-verify voltage is applied to its control gate may be used to indicate whether the memory cell is conductive or non-conductive and thus indicate whether its threshold voltage is higher or lower than the program-verify voltage.

FIG. 11B illustrates an example of drain current (Id) as a function of gate voltage (Vg) for a memory cell. Drain currents corresponding to tripping of a comparison circuit are illustrated for sense times tsense1 (Isen-1) and tsense2 (Isen_2). Isen-1 may be a current at which the memory cell is considered conductive or "on" when sensing for time tsense1 so that when discharge current through a memory cell is greater than Isen-1, the memory cell will be considered to be in a data state corresponding to a higher threshold voltage range. Isen-2 may be a current at which the memory cell is considered conductive or "on" when sensing for time tsense2 so that when discharge current through a memory cell is greater than Isen-2, the memory cell will be considered to be in a data state corresponding to a higher threshold voltage range. Isen-1 and Isen-2 may correspond to currents sufficient to discharge a bit line to a voltage equal to a reference voltage used by a comparator (e.g., comparison circuit 320) in respective times tsense1 and tsense2 (e.g., higher current Isen-1 over shorter time tsense1 may discharge to the same voltage as lower current Isen-2 over longer time tsense2). A memory cell that is read under the same conditions (e.g., same gate voltages) using two sense times tsense1 and tsense2 will appear to have corresponding gate voltages Vr1 and Vr2. Thus, the sensed threshold voltage of a memory cell may be lowered by SV by increasing sense time by St. In this way, sensed threshold voltage distributions such as Sx and Sx-1 of FIGS. 8 and 9 may be shifted down by increasing sense time, which may have a similar effect to moving read reference voltages up (e.g., from Vrx to Vrx' in FIG. 8 or to Vrx1-Vrxn in FIG. 9).

Figure 12:
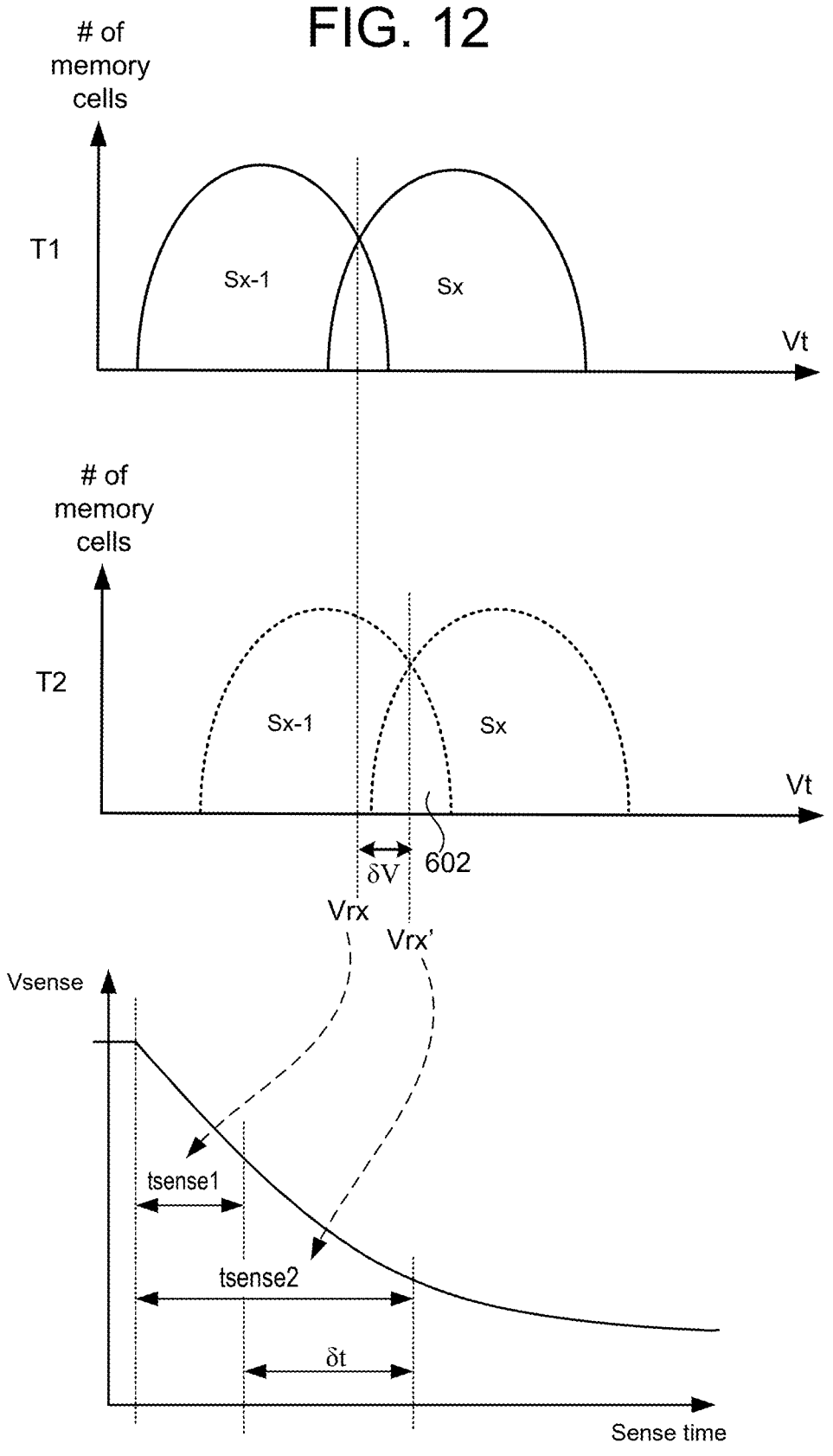
FIG. 12 illustrates a temperature-dependent hard-bit read.

FIG. 12 illustrates shifted threshold voltage distributions Sx and Sx-1 due to temperature change, with the upper plot showing distributions at temperature T1 and the middle plot showing distributions at temperature T2. In order to provide data with an acceptable error rate, a read reference voltage may be shifted by SV from Vrx to Vrx'. An appropriate shift may be determined from a temperature measurement value. For example, a temperature transducer in a nonvolatile memory system (e.g., on a memory die, a control die, in a controller or otherwise) may generate a temperature measurement value when a read is performed and read reference voltage may be adjusted accordingly (e.g., the magnitude of SV may be a function of temperature difference T2-T1). Alternatively, sense time may be changed by St, from tsense1 to tsense2, as shown in the bottom plot. For example, the time offset St may be a function of the temperature difference T2-T1. Such a time offset may be applied, for example, when performing a hard-read in order to obtain temperature-dependent hard-read data. For example, a hard-read sense time or Hard Bit Read (HBR) may be adjusted according to the equation:

$$\text{Adjusted HBR time} = HBR_0 + HBR\_Offset(T) \qquad \text{(Equation 1)}$$

Where $HBR_0$ may be a reference HBR time, for example at a reference temperature or default temperature and Offset (T) is an offset value that is a function of temperature T. Applying this to the example of FIG. 12, where T1 is a reference temperature gives:

$$\text{Adjusted HBR time at temperature } T2 = tsense1 + H$$
$$(T2-T1) \qquad \text{(Equation 2)}$$

The value of constant "H" may be found from experiment, modeling, or otherwise. Different sense times may be used to implement hard and soft reads of nonvolatile memory cells in an efficient manner using different sense times. Temperature-dependent (temperature-adjusted) soft-reads may be combined with temperature-dependent hard-reads (e.g., by applying temperature-dependent offsets to temperature-dependent hard-read reference voltages or times). Aspects of the present technology enable such soft-reads to be performed in an efficient manner over a range of conditions including different environmental conditions such as different temperatures.

Figure 13:
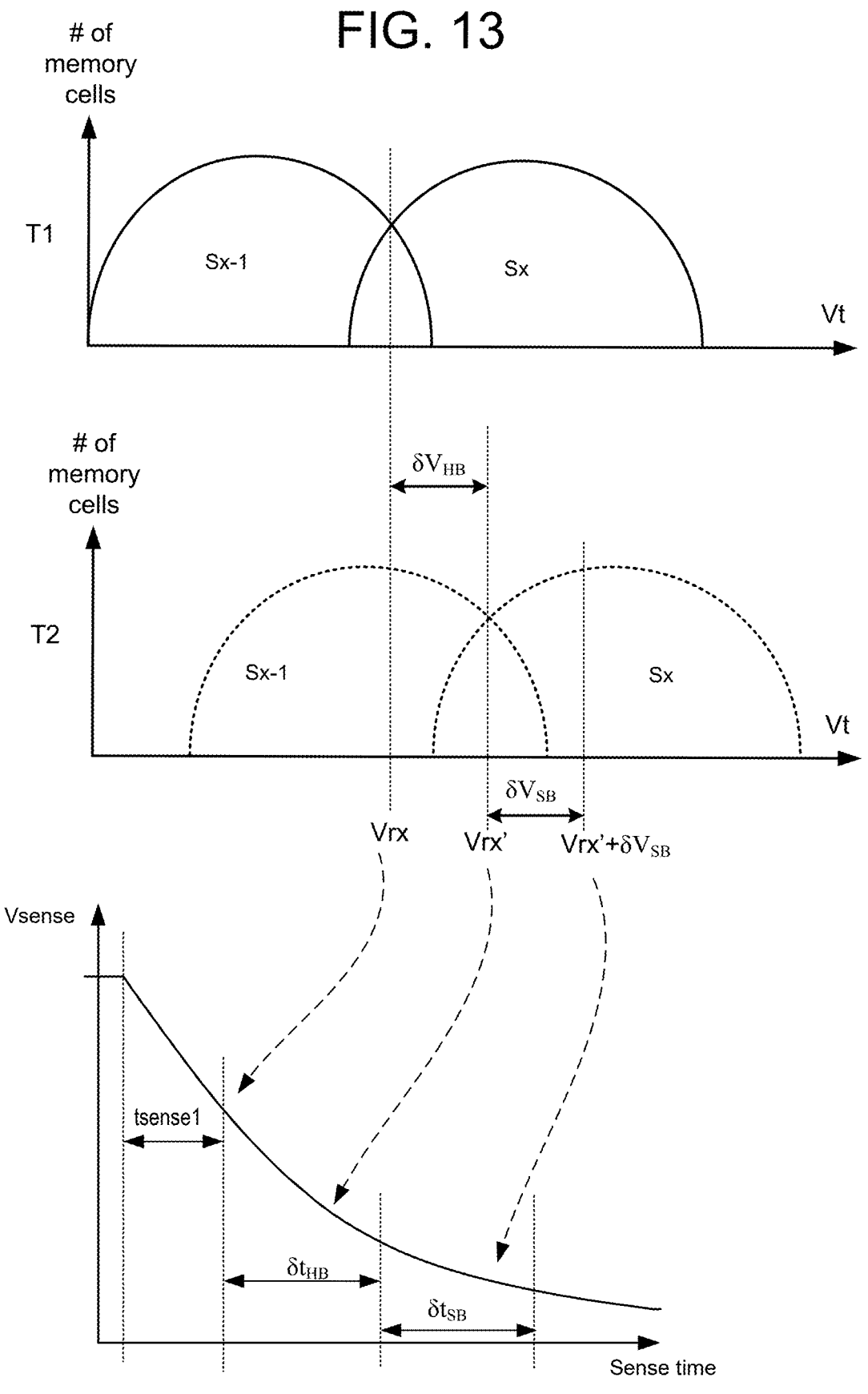
FIG. 13 illustrates a soft-read using a sense time that is offset from a hard-read sense time by a temperature-dependent soft-read offset.

FIG. 13 shows an example of two threshold voltage distributions at two temperatures, T1 and T2, with a HBR voltage Vrx used at T1 (top plot) and a temperature-dependent HBR voltage Vrx' used at T2, where Vrx' is shifted by a hard-bit offset, $\delta V_{HB}$ with respect to Vrx (e.g., Vrx'=Vrx+ $\delta V_{HB}$) and where $\delta V_{HB}$ may be temperature-dependent as described with respect to FIG. 12. In addition, FIG. 13 shows a soft-read reference voltage Vrx'+$\delta V_{SB}$, used at temperature T2, which is offset from the hard-read reference voltage Vrx' at temperature T2 by a soft-bit offset voltage $\delta V_{SB}$ (middle plot).

FIG. 13 further shows an implementation that uses different sense times (bottom plot) according to temperature (e.g., instead of different read reference voltages) including a first sense time, tsense1, which may be used to perform a HBR at temperature T1, a hard-bit offset time, $\delta t_{HB}$, that may be used to perform a temperature-dependent HBR at temperature T2 and a soft-read offset time $\delta t_{SB}$ that may be used as an offset from the temperature-dependent hard-read sense time. Thus, the sense time used to perform a soft-read sense operation at temperature T2 may be the sum of a reference sense time (e.g., tsense1) plus a temperature-dependent HBR offset (e.g., $\delta t_{HB}$), plus a temperature-dependent soft-read offset time (e.g., $\delta t_{SB}$). The soft-read offset time may be temperature dependent so that SBR offsets used at temperatures T1 and T2 may be different. Thus, performing the SBR shown at temperature T2 may include sensing for a sense time obtained by adding a soft-read offset time ($\delta t_{SB}$) to a hard-read sense time (tsense1+$\delta t_{HB}$), The soft-read offset time (e.g., $\delta t_{SB}$) may be dependent on temperature (e.g., on a temperature measurement value) such that different soft-read offset times are applied for different temperature measurement values (e.g., a different temperature offset time would be applied at temperature T1), for example, as in equation 3:

$$\text{Adjusted SBR time=HBR time+SBR\_Offset(T)} \quad \text{(Equation 3)}$$

For example, the temperature-dependent SBR offset, SBR_Offset(T) may include a temperature-independent term and a temperature-dependent term and the temperature-dependent term may be proportional to a temperature difference from a reference temperature (e.g., T0) to give:

$$\text{Adjusted SBR time at temperature T=HBR time+S} \\ (1+K(T-T0)) \quad \text{(Equation 4)}$$

Where S is the temperature-independent portion and S*K(T−T0) is the temperature-dependent portion. In a soft-read operation, multiple sensing operations may be performed using different sense times, with one or more (e.g., all) soft-read sense times being temperature-dependent.

Figure 14:
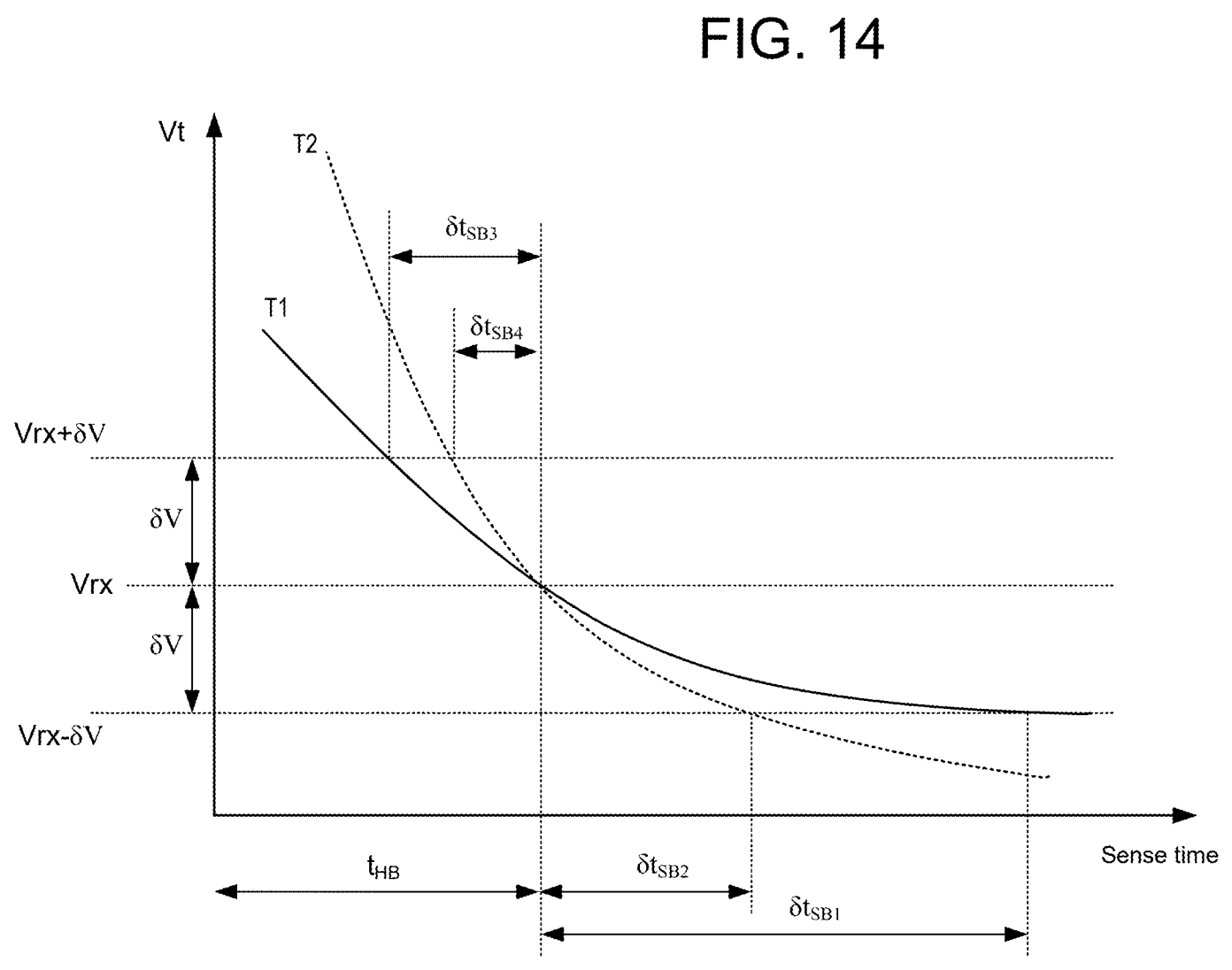

Aspects of the present technology may be understood with respect to FIG. 14 which shows two curves illustrating the relationship between memory cell threshold voltage and sense time at two different temperatures, T1 (solid line) and T2 (dotted line). For example, a hard-bit read may be performed using read-voltage Vrx and hard-read sense time $t_{HB}$. The same sense time $t_{HB}$ is used for temperatures T1 and T2 in this example (e.g., no adjustment of HBR sense time) for simplicity of illustration.

When a soft-bit read is performed at a voltage offset of δV from the HBR read reference voltage (e.g., at Vrx-δV), the sense time offsets used depend on temperature with $\delta t_{SB1}$ being used at temperature T1 and $\delta t_{SB2}$ being used at temperature T2 (for example, T2 may be greater than T1 and a larger temperature-dependent offset may be needed at lower temperature T1).

FIG. 14 also shows that temperature-dependent offsets are not symmetric in that SBR sense times corresponding Vrx+ δV are not the same as used at Vrx-δV. For example, at temperature T1, a third temperature-dependent offset $\delta t_{SB3}$ (which is not equal to $\delta t_{SB1}$) may be used and at temperature T2, a fourth temperature-dependent offset $\delta t_{SB4}$ (which is not equal to $\delta t_{SB2}$) may be used. Such asymmetric patterns may be handled by using different temperature-dependent offset terms for positive and negative offsets from a HBR sense time. For example, equation 4 may be rewritten as two equations:

$$\text{Adjusted positive SBR time at temp T=HBR time+S} \\ (1+Kpos(T-T0)) \quad \text{(Equation 5)}$$

$$\text{Adjusted negative SBR time at temp T=HBR time+S} \\ (1+Kneg(T-T0)) \quad \text{(Equation 6)}$$

Where values of Kpos and Kneg may be constant values found from experiment, modeling, or otherwise and where HBR time may also be temperature-dependent (e.g., as in Equation 1 or 2). While FIG. 14 illustrates two temperature-dependent soft-reads, additional temperature-dependent soft-read sense times may be obtained and additional temperature-dependent reads may be performed and the present technology is not limited to any particular number or pattern of temperature-dependent soft reads.

In some cases, equations like Equations 5 and 6 may be used by control circuits of a nonvolatile memory system to calculate appropriate temperature-dependent positive and negative soft-read offset times (e.g., based on a measured temperature value from on-chip temperature measurement). In an alternative embodiment, temperature-dependent soft-read offset times may be stored in a lookup table or other format and an appropriate temperature-dependent soft-read offset time may be found for a given sense operation by searching the lookup table (e.g., using a measured temperature value) to find a corresponding entry. A range of temperature values may be represented by a single row in such a table so that the same temperature-dependent soft-read offset time may be used for a relatively wide temperature range.

While aspects of the present technology may be applied to any nonvolatile memory system, in some cases it may be desirable to selectively apply techniques that may add overhead and consume resources. For example, SLC memory, which stores data using only two data states per memory cell may be relatively unaffected by temperature effects described above and temperature-dependent SBR offset times may be disabled for SLC memory. Similarly, in some cases TLC memory may not benefit sufficiently from some described techniques so that temperature-adjustment may be disabled for TLC (e.g., enabled for QLC only, or higher density MLC).

Figure 15:
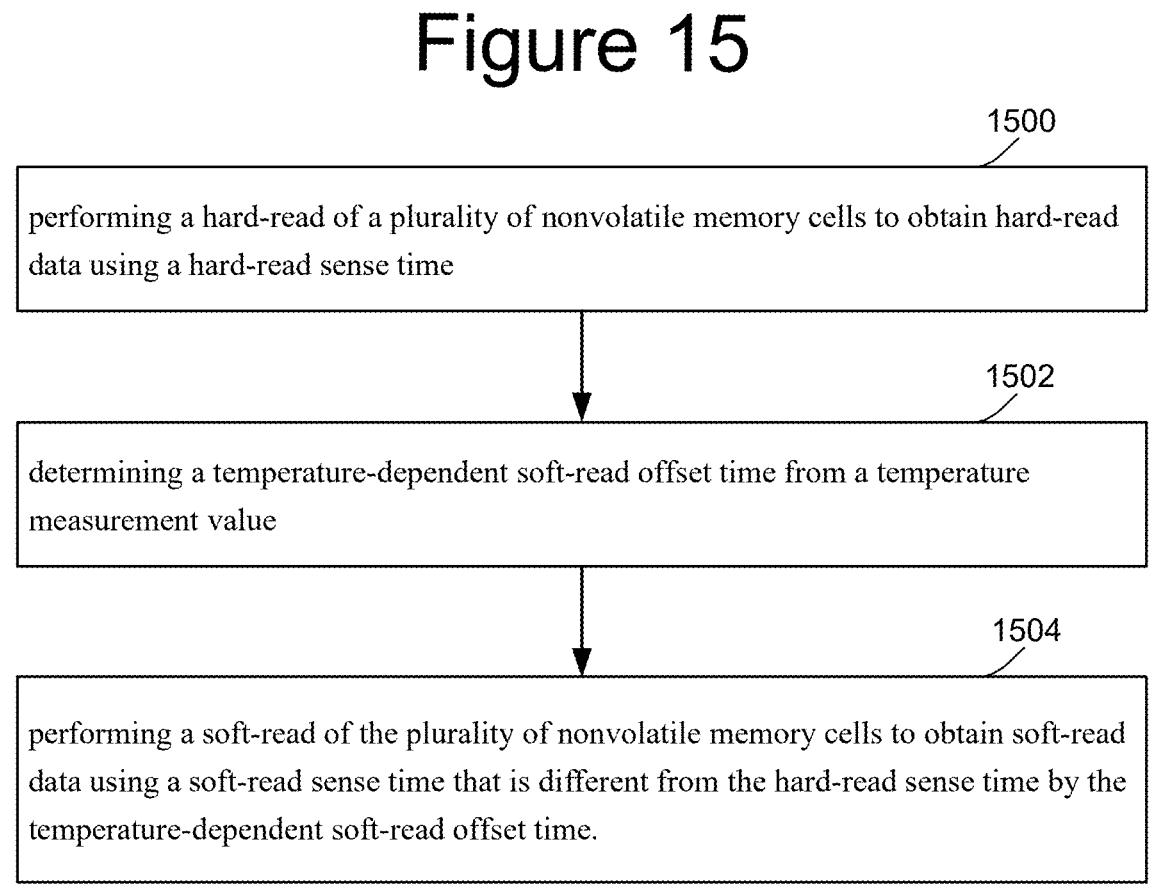

FIG. 15 shows an example of a method that may be implemented by control circuits described above. The method includes, performing a hard-read of a plurality of nonvolatile memory cells to obtain hard-read data using a hard-read sense time 1500 (e.g., $t_{HB}$), determining a temperature-dependent soft-read offset time from a temperature measurement value 1502 (e.g., determining one or more of $\delta t_{SB1}$ to $\delta t_{SB4}$) and performing a soft-read of the plurality of nonvolatile memory cells to obtain soft-read data using a soft-read sense time that is different from the hard-read sense time by the temperature-dependent soft-read offset time 1504. Multiple soft-reads using respective temperature-dependent soft-read sense times may be performed.

FIG. 16 shows an example of a method that includes steps that may be performed with the steps of FIG. 15 in some cases. The method includes performing Error Correction Code (ECC) decoding of the hard-read data 1610, determining that the hard-read data is uncorrectable by ECC 1612 and in response, initiating the soft-read of the plurality of nonvolatile memory cells 1614 (e.g., in response to obtaining UECC data with a hard-read at Vrx, initiating a soft-read using one or more temperature-dependent offset time). The method further includes performing ECC decoding of the soft-read data 1616 and, in response to obtaining ECC-corrected data from the soft-read data, sending the ECC corrected data in response to a read command 1618 (e.g., sending data from storage system 100 to host 102).

Techniques of the present technology including the methods illustrated in FIGS. 15-16 may be implemented by suitable control circuits (e.g., any combination of memory controller 120, state machine 262, all or a portion of system control logic 260, all or a portion of row control circuitry 220, all or a portion of column control circuitry 210, read/write circuits 225, sense amps, a microcontroller, a microprocessor, and/or other similar functioned circuits), which may be considered means for performing a soft-bit read of a plurality of nonvolatile memory cells by sensing the plurality of nonvolatile memory cells for a temperature-dependent sense time obtained by adding a temperature-dependent soft-read offset time to a hard-read sense time, the temperature-dependent soft-read offset time dependent on a temperature measurement value such that different temperature-dependent soft-read offset times are applied for different temperature measurement values.

According to examples of the present technology, one or more control circuits are configured to connect to a plurality of nonvolatile memory cells. The one or more control circuits are configured to perform a soft-bit read of the plurality of nonvolatile memory cells by sensing the plurality of nonvolatile memory cells for a sense time obtained by adding a soft-read offset time to a hard-read sense time. The soft-read offset time is dependent on a temperature measurement value such that different soft-read offset times are applied for different temperature measurement values.

The one or more control circuits may be further configured to obtain the hard-read sense time from the temperature measurement value such that different hard-read sense times are obtained for different temperature measurement values. The one or more control circuits may be located on a die and the temperature measurement value may be obtained from a temperature transducer on the die. The die may be a memory die that includes the plurality of nonvolatile memory cells. The die may be a control die that does not include the plurality of nonvolatile memory cells. The one or more control circuits may be configured to sense the plurality of nonvolatile memory cells for the sense time by discharging a plurality of bit lines connected to the plurality of nonvolatile memory cells for the sense time and at the end of the sense time, comparing voltages of sense nodes with a reference voltage. The one or more control circuits may be configured to calculate the soft-read offset time from the temperature measurement value by multiplying the temperature measurement value by a constant value. The one or more control circuits may be configured to obtain the soft-read offset time from the temperature measurement value from a lookup table that includes a plurality of soft-read offset values. The plurality of nonvolatile memory cells may be arranged in vertical NAND strings and are configured for Multi Level Cell (MLC) data storage. The one or more control circuits may be configured to perform ECC decoding of data from a hard-bit read of the plurality of nonvolatile memory cells and to initiate the a soft-bit read of the plurality of nonvolatile memory cells in response to failure of ECC decoding of the hard-bit read data.

An example method includes performing a hard-read of a plurality of nonvolatile memory cells to obtain hard-read data using a hard-read sense time determining a temperature-dependent soft-read offset time from a temperature measurement value; and performing a soft-read of the plurality of nonvolatile memory cells to obtain soft-read data using a soft-read sense time that is different from the hard-read sense time by the temperature-dependent soft-read offset time.

The method may further include performing Error Correction Code (ECC) decoding of the hard-read data; determining that the hard-read data is uncorrectable by ECC; and in response, initiating the soft-read of the plurality of nonvolatile memory cells. The method may further include performing ECC decoding of the soft-read data; and in response to obtaining ECC-corrected data from the soft-read data, sending the ECC corrected data in response to a read command. The method may further include in response to obtaining the ECC-corrected data from the soft-read data, writing the ECC-corrected data to a new location in a new plurality of nonvolatile memory cells. The method may further include performing a temperature measurement on a die that includes the plurality of nonvolatile memory cells to obtain the temperature measurement value. The method may further include determining a plurality of additional temperature-dependent soft-read offset times from the temperature measurement value; and performing a plurality of additional soft-reads of the plurality of nonvolatile memory cells to obtain additional soft-read data using a plurality of soft-read sense times that are different from the hard-read sense time by respective temperature-dependent soft-read offset times. The plurality of additional temperature-dependent soft-read offset times may be individually calculated from the temperature measurement value such that temperature-dependent soft-read offset times form an asymmetric pattern around the hard-read sense time. The method may further include calculating a first soft-read sense time at a first temperature; and calculating a second soft-read sense time that is greater than the first soft-read sense time at a second temperature that is less than the first temperature.

An example storage system includes a plurality of nonvolatile memory cells arranged in NAND strings; and means for performing a soft-bit read of the plurality of nonvolatile memory cells by sensing the plurality of nonvolatile memory cells for a temperature-dependent sense time obtained by adding a temperature-dependent soft-read offset time to a hard-read sense time, the temperature-dependent soft-read offset time is dependent on a temperature measurement value such that different temperature-dependent soft-read offset times are applied for different temperature measurement values.

The plurality of NAND strings may be located on a first die and the means for performing a soft-bit read is located on a second die that is connected to the first die.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
one or more control circuits configured to connect to a plurality of nonvolatile memory cells, wherein the one or more control circuits are configured to:
perform a soft-bit read of the plurality of nonvolatile memory cells by sensing the plurality of nonvolatile memory cells for a sense time obtained by adding a soft-read offset time to a hard-read sense time, the soft-read offset time is dependent on a temperature measurement value such that different soft-read offset times are applied for different temperature measurement values.

2. The apparatus of claim 1, wherein the one or more control circuits are further configured to obtain the hard-read sense time from the temperature measurement value such that different hard-read sense times are obtained for different temperature measurement values.

3. The apparatus of claim 1, wherein the one or more control circuits are located on a die and the temperature measurement value is obtained from a temperature transducer on the die.

4. The apparatus of claim 3, wherein the die is a memory die that includes the plurality of nonvolatile memory cells.

5. The apparatus of claim 3, wherein the die is a control die that does not include the plurality of nonvolatile memory cells.

6. The apparatus of claim 1, wherein the one or more control circuits are configured to sense the plurality of nonvolatile memory cells for the sense time by discharging a plurality of bit lines connected to the plurality of nonvolatile memory cells for the sense time and at the end of the sense time, comparing voltages of sense nodes with a reference voltage.

7. The apparatus of claim 1, wherein the one or more control circuits are configured to calculate the soft-read offset time from the temperature measurement value by multiplying the temperature measurement value by a constant value.

8. The apparatus of claim 1, wherein the one or more control circuits are configured to obtain the soft-read offset time from the temperature measurement value from a lookup table that includes a plurality of soft-read offset values.

9. The apparatus of claim 1, wherein the plurality of nonvolatile memory cells are arranged in vertical NAND strings and are configured for Multi Level Cell (MLC) data storage.

10. The apparatus of claim 9, wherein the one or more control circuits are configured to perform ECC decoding of data from a hard-bit read of the plurality of nonvolatile memory cells and to initiate the a soft-bit read of the plurality of nonvolatile memory cells in response to failure of ECC decoding of the hard-bit read data.

11. A method comprising:
performing a hard-read of a plurality of nonvolatile memory cells to obtain hard-read data using a hard-read sense time;
determining a temperature-dependent soft-read offset time from a temperature measurement value; and
performing a soft-read of the plurality of nonvolatile memory cells to obtain soft-read data using a soft-read sense time that is the sum of the hard-read sense time and the temperature-dependent soft-read offset time.

12. The method of claim 11, further comprising:
performing Error Correction Code (ECC) decoding of the hard-read data;
determining that the hard-read data is uncorrectable by ECC; and
in response, initiating the soft-read of the plurality of nonvolatile memory cells.

13. The method of claim 12, further comprising:
performing ECC decoding of the soft-read data; and
in response to obtaining ECC-corrected data from the soft-read data, sending the ECC corrected data in response to a read command.

14. The method of claim 13, further comprising:
in response to obtaining the ECC-corrected data from the soft-read data, writing the ECC-corrected data to a new location in a new plurality of nonvolatile memory cells.

15. The method of claim 11, further comprising:
performing a temperature measurement on a die that includes the plurality of nonvolatile memory cells to obtain the temperature measurement value.

16. The method of claim 11, further comprising:
determining a plurality of additional temperature-dependent soft-read offset times from the temperature measurement value; and
performing a plurality of additional soft-reads of the plurality of nonvolatile memory cells to obtain additional soft-read data using a plurality of soft-read sense times that are different from the hard-read sense time by respective temperature-dependent soft-read offset times.

17. The method of claim 16, wherein the plurality of additional temperature-dependent soft-read offset times are individually calculated from the temperature measurement value such that temperature-dependent soft-read offset times form an asymmetric pattern around the hard-read sense time.

18. The method of claim 11, further comprising:
calculating a first soft-read sense time at a first temperature; and
calculating a second soft-read sense time that is greater than the first soft-read sense time at a second temperature that is less than the first temperature.

19. A storage system comprising:
a plurality of nonvolatile memory cells arranged in NAND strings; and
means for performing a soft-bit read of the plurality of nonvolatile memory cells by sensing the plurality of nonvolatile memory cells for a temperature-dependent sense time obtained by adding a temperature-dependent soft-read offset time to a hard-read sense time, the temperature-dependent soft-read offset time is dependent on a temperature measurement value such that different temperature-dependent soft-read offset times are applied for different temperature measurement values.

20. The storage system of claim 19, wherein the NAND strings are located on a first die and the means for performing a soft-bit read is located on a second die that is connected to the first die.

* * * * *